United States Patent
Kajiwara et al.

[11] Patent Number: 5,884,835
[45] Date of Patent: Mar. 23, 1999

[54] ULTRASONIC BONDING METHOD AND ULTRASONIC BONDING APPARATUS

[75] Inventors: Ryoichi Kajiwara, Hitachi; Toshiyuki Takahashi; Kazuya Takahashi, both of Hitachinaka; Masahiro Koizumi, Hitachi; Hiroshi Watanabe, Kodaira; Yukiharu Akiyama, Koganei, all of Japan

[73] Assignee: Hitachi, Ltd., Tokyo, Japan

[21] Appl. No.: 686,538

[22] Filed: Jul. 26, 1996

[30] Foreign Application Priority Data

Jul. 26, 1995 [JP] Japan .................................. 7-190410

[51] Int. Cl.$^6$ .................................................. H01L 21/607
[52] U.S. Cl. .................................... 228/110.1; 228/4.5
[58] Field of Search .............................. 278/1.1, 110.1, 278/180.5, 102, 103, 4.5

[56] References Cited

U.S. PATENT DOCUMENTS

| | | | |
|---|---|---|---|
| 5,360,155 | 11/1994 | Ooki et al. | 228/1.1 |
| 5,431,324 | 7/1995 | Kajiwara et al. | 228/110.1 |
| 5,494,207 | 2/1996 | Asanasavest | 228/110.1 |
| 5,626,276 | 5/1997 | Lo et al. | 228/4.5 |

*Primary Examiner*—Samuel M. Heinrich
*Attorney, Agent, or Firm*—Antonelli, Terry, Stout & Kraus, LLP

[57] ABSTRACT

In a case of ultrasonic bonding of a bonding wire to a metal pad provided on a semiconductor substrate, the vibration amplitude of a tip end of the bonding tool is set to be smaller than the film thickness of the metal pad, and the vibration frequency of the bonding tool is set to be higher than 70 kHz. According physical damage, such as cracks produced in a portion beneath the metal pad, can be prevented.

8 Claims, 5 Drawing Sheets

ULTRASONIC BONDING METHOD AND ULTRASONIC BONDING APPARATUS

BACKGROUND OF THE INVENTION

The present invention relates to an ultrasonic bonding method and an ultrasonic bonding apparatus for connecting bonding wires to metal pads on a semiconductor device.

In a semiconductor device having the form of an ultra-large scale integrated circuit, it is required to connect bonding wires to a large member of metal pads provided at given positions on a substrate of the semiconductor device through bonding to form circuits.

An ultrasonic bonding method using an ultrasonic bonding apparatus is generally utilized for the bonding. In the ultrasonic bonding method, when a bonding wire is bonded to a metal pad on a substrate of a semiconductor device, ball-bonding or wedge-bonding is performed while an ultrasonic vibration having a frequency of 60 kHz or 120 kHz is being applied to the bonding wire.

The most general bonding method in the prior art is a method in which a bonding wire is ball-bonded to a metal pad on a substrate of a semiconductor device while an ultrasonic vibration having a frequency of 60 kHz is being applied to the bonding wire. In an ultrasonic bonding apparatus which is used for such ultrasonic bonding, the maximum vibration amplitude of the bonding tool tip end of the apparatus is above 5 $\mu$m.

In the case of using such an ultrasonic bonding apparatus, it is preferable to use a gold (Au) wire having a diameter of 25 $\mu$m to 38 $\mu$m as the bonding wire; and the ultrasonic bonding is performed under a condition in which the connecting portion (work) is pre-heated above 200° C., and the vibration amplitude of the bonding tool tip end is selected to be 2 $\mu$m to 3 $\mu$m in order to perform high strength ultrasonic bonding.

Another ultrasonic bonding method in the prior art is a method in which a bonding wire is wedge-bonded to a metal pad on a substrate of a semiconductor device while an ultrasonic vibration having a frequency of 120 kHz is being applied to the bonding wire. In an ultrasonic bonding apparatus used in such ultrasonic bonding, the maximum vibration amplitude of the bonding tool tip end of the apparatus is above 4 $\mu$m.

In the case of using the ultrasonic bonding apparatus, the vibration amplitude of the bonding tool tip end is selected to be 2 $\mu$m to 3 $\mu$m in order to perform high strength ultrasonic bonding, the same as the vibration amplitude employed in the general bonding method.

The principle of the ultrasonic bonding in the ultrasonic bonding method of the prior art is as follows. The bonding is performed by effecting contact between two materials in solid state which are to be bonded to each other, that is, by causing a metallic material forming the bonding wire, for example, a gold (Au) wire, to come into contact with a metallic material forming the metal pad, for example, an aluminum (Al) pad, and then applying frictional vibration to the gold (Au) wire to bond it to the aluminum (Al) pad.

As the materials are pressed into contact with each other, a metallic coupling is produced between the metallic materials so that these metallic materials become attached to each other closely up to an atomic interval level, while a bonding interruption substance and an oxide film attached on the bonding surface portions of the two metallic materials are being removed, whereby the desired bonding is accomplished.

In general, the metal pad provided on the semiconductor device, such as an ultra-large scale integrated device, that is, the aluminum (Al) pad, is an aluminum (Al) alloy film having a thickness of several thousands Å to several $\mu$m provided on a silicon dioxide ($SiO_2$) insulator film, which has a thickness of several hundreds Å to one thousand and several hundreds Å and is provided on a silicon (Si) semiconductor substrate.

In the aluminum (Al) pad having such a construction, there are some cases where silicon (Si) is deposited inside the aluminum (Al) alloy film depending on the kind of aluminum (Al) alloys, and nodules of silicon (Si) are formed in the aluminum (Al) pad by the deposition of silicon (Si).

In a case where a gold (Au) bonding wire is ball-bonded to an aluminum (Al) pad through ultrasonic bonding, the bonding is performed by applying a vibration to the gold (Au) wire and the aluminum (Al) pad while a ball portion formed at the end portion of the gold (Au) wire is pressed to the surface of the aluminum (Al) pad using the ultrasonic bonding apparatus.

While performing the ultrasonic bonding, a high shear stress and an internal strain are applied to the internal portion of the aluminum (Al) alloy film, which is being pressed by the ball portion, and the interface portion of the aluminum (Al) alloy film and the silicon dioxide ($SiO_2$) insulation film.

When the magnitudes of the shear stress and the internal strain exceed certain values, micro-cracks are produced inside the silicon dioxide ($SiO_2$) insulation film, and in an extreme case cracks are produced inside the silicon (Si) semiconductor substrate.

In a case where cracks are produced inside the silicon dioxide ($SiO_2$) insulation film or inside the silicon (Si) semiconductor substrate, if nodules of silicon (Si) are formed in the aluminum (Al) alloy film, shear stress, which is produced in the aluminum (Al) pad when the aluminum (Al) pad is pressed by the gold (Au) ball, is concentrated at the peripheral portion of the nodule of silicon (Si), and fine cracks are easily produced in the silicon dioxide ($SiO_2$) insulator film, even if the pressing force for a friction vibration is comparatively small and is under a low loading condition.

Further, in a case where the silicon dioxide ($SiO_2$) insulator film is thinner than a given thickness, or in a case where the silicon dioxide ($SiO_2$) insulator film is of a multi-layer structure having a layer of a different kind of material formed under it, fine cracks are easily produced in the silicon dioxide ($SiO_2$) insulator film, even if the pressing force for the friction vibration is comparatively small and is under a low loading condition, as described above.

In a case where fine cracks are formed in the silicon dioxide ($SiO_2$) insulator film, the fine cracks are apt to produce large cracks so as to cause pealing of the ball bonding after that.

Furthermore, in a case where the semiconductor substrate is made of a comparatively brittle material, such as gallium-arsenic (GaAs), phosphorous-indium (InP) or the like, even if the pressing force for the friction vibration is small at the time of performing the ultrasonic bonding, there is a possibility to produce cracks which are sufficiently large to reach the semiconductor device substrate soon after completion of the ultrasonic bonding.

As described above, in the ultrasonic bonding method of the prior art, there are problems in that cracks are produced in the silicon dioxide ($SiO_2$) insulator film provided on a substrate of a semiconductor device, so that the various kinds of characteristics necessary for the semiconductor device are damaged, and then the reliability the semiconductor device is lost or the productivity is decreased.

SUMMARY OF THE INVENTION

An object of the present invention is to provide an ultrasonic bonding method and an ultrasonic bonding apparatus wherein physical damage occurring in the bottom portion of a metal pad is decreased when a bonding wire is bonded to a metal pad provided on a semiconductor substrate through ultrasonic bonding.

In accordance with the present invention, for connecting a bonding to a metal pad provided on a semiconductor substrate through ultrasonic bonding using an ultrasonic bonding apparatus, the ultrasonic bonding is performed by limiting the vibration amplitude of the tip end of a bonding tool of the ultrasonic bonding apparatus to a value smaller than the film thickness of the metal pad and by setting the vibration frequency to a value higher than 70 kHz.

Further, in accordance with the present invention, the ultrasonic vibrator is a piezoelectric element, and the vibration amplitude A ($\mu$m) of the tip end of the bonding tool under a no-load condition satisfies $A \leq 4E^{1.6/3}$ when the electric power E input into the piezoelectric element is within the range of $0.001(W) \leq E \leq 1.0(W)$, and the vibration amplitude A ($\mu$m) under a no-load condition satisfies $A \leq 4$ ($\mu$m) when the electric power E input into the piezoelectric element is within the range of $1.0(W) \leq E \leq 10.0(W)$.

It is preferable to set the vibration amplitude of the tip end of the bonding tool to a value larger than one-half of the vibration amplitude A ($\mu$m) under a no-load condition when the bonding load during the bonding operation is within 10 Newtons.

Further, it is preferable to employ supplemental means to set the ultrasonic frequency of the mechanical vibration produced by the ultrasonic vibrator to a value above 100 kHz and to vibrate the tip end of the bonding tool so that the vibration amplitude A ($\mu$m) under a no-load condition and the vibration frequency f (kHz) satisfy the relationship log $A \geq -0.31 \times \log f^2 + 1.414$.

According to the present invention, the ultrasonic bonding is performed by setting the vibration amplitude of the tip end of a bonding tool of the ultrasonic bonding apparatus to a value smaller than the film thickness of the metal pad and by setting the vibration frequency to a value higher than 70 kHz, which is higher than the vibration frequency of 60 kHz used in the prior art.

Therefore, a large shear stress or a large pressure strain is less likely to act not only on the metal pad, but also on the insulator film or the semiconductor substrate under the metal pad, and accordingly the probability of occurrence of fine physical failures, such as micro-cracks or cracks in the metal pad itself, or in the insulator film or the semiconductor substrate under the metal pad, is substantially reduced. As a result, the degradations in various kinds of characteristics of the semiconductor device after ultrasonic bonding can be prevented.

In this regard, the vibration amplitude of the tip end of a bonding tool of the ultrasonic bonding apparatus is set to a value smaller than the film thickness of the metal pad, and preferably to a value smaller than one-half of the film thickness of the metal pad. Thereby, the occurrence of fine physical failures, such as micro-cracks or cracks, can be completely eliminated.

In ultrasonic bonding, if only the vibration amplitude of the tip end of the bonding tool of the bonding apparatus is decreased, a shortage of friction energy required for producing bonding between the metal pad and the metallic wire occurs, although shear stress in the ball portion can be lowered below the allowable shear strength of 0.3 Newton (N) during ball bonding.

On the other hand, in accordance with the present invention, since the vibration frequency is increased to a value higher than that in the prior art and the vibration amplitude is reduced as well, a shortage of the input energy required for producing ultrasonic bonding can be compensated and ultrasonic bonding can be performed under a good condition, as described above.

Further, according to the present invention, the vibration amplitude A ($\mu$m) of the tip end of the bonding tool under a no-load condition satisfies $A \leq 4E^{1.6/3}$ when the electric power E supplied to the piezoelectric element is within the range of $0.001(W) \leq E \leq 1.0(W)$, and the vibration amplitude A ($\mu$m) under a no-load condition satisfies $A \leq 4$ ($\mu$m) when the electric power E supplied to the piezoelectric element is within the range of $1.0(W) \leq E \leq 10.0(W)$.

In this way, a large shear stress or a large pressure strain is less likely to act not only on the metal pad, but also on the insulator film or the semiconductor substrate, and accordingly the probability of occurrence of fine physical failures, such as micro-cracks or cracks, in the metal pad itself or in the insulator film or in the semiconductor substrate under the metal pad is substantially reduced. As a result, the degradations in the various kinds of characteristics of the semiconductor device due to the ultrasonic bonding can be prevented.

In this case, the vibration amplitude of the bonding tool is selected to have a value larger than one-half of the vibration amplitude A ($\mu$m) under a no-load condition when the bonding load during bonding is within 10 Newtons, or the ultrasonic frequency of the mechanical vibration produced by the ultrasonic vibrator is selected to have a value above 100 kHz, and the vibration amplitude A ($\mu$m) under a no-load condition and the vibration frequency f (kHz) satisfy the relationship log $A \geq -0.31 \times \log f^2 + 1.414$.

In this way, the effect described above can be promoted, and accordingly the probability of occurrence of fine physical failures, such as micro-cracks or cracks, can be substantially reduced, and the degradations in the various kinds of characteristics of the semiconductor device due to the ultrasonic bonding can be prevented remarkably.

DETAILED DESCRIPTION OF THE PREFERRED EMBODIMENTS

Figure 1:
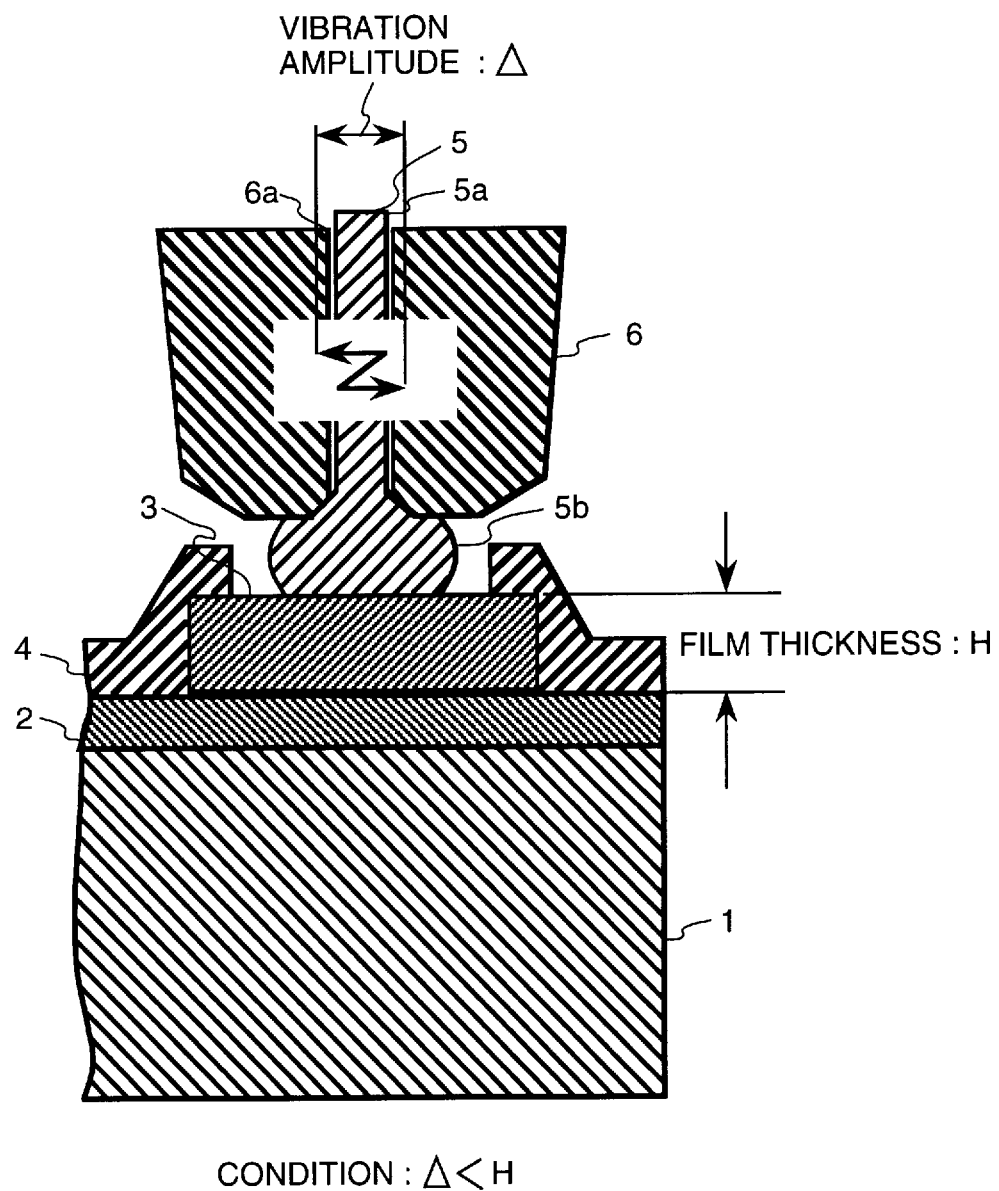
FIG. 1 is a cross-sectional view showing an ultrasonic bonding portion in a case where an ultrasonic bonding method in accordance with the present invention is performed.

FIG. 1 is a cross-sectional view showing an ultrasonic bonding portion in a case where an ultrasonic bonding method in accordance with the present invention is performed.

Referring to FIG. 1, the reference character 1 denotes a silicon (Si) substrate (semiconductor substrate), on which there is disposed a silicon dioxide (SiO$_2$) insulator film 2, an aluminum-silicon-copper (Al—Si—Cu) alloy pad 3 (a metal pad, hereinafter referred to as alloy pad), and a protective passivation film 4, and a gold (Au) bonding wire 5 made up of a wire portion 5a and a ball portion 5b. The reference character 6 denotes a capillary tool (bonding tool) of an ultrasonic bonding apparatus (not shown) and the reference character 6a denotes a wire support hole therein.

The silicon (Si) substrate 1 of the semiconductor device has the silicon dioxide (SiO$_2$) insulation film 2 provided on its upper side. The silicon dioxide (SiO$_2$) insulation film 2 has the alloy pad 3 and the protective passivation film 4 provided on its upper side. The protective passivation film 4 is provided so as to cover the whole silicon (Si) substrate 1 except for the exposed electrode portion of the alloy pad 3.

The bonding wire 5 is composed of the wire portion 5a having a constant diameter and the larger diameter ball portion 5b provided at one end of the bonding wire. The capillary tool 6 of the ultrasonic bonding apparatus has the wire support hole 6a in its center, and the wire portion 5a of the bonding wire 5 penetrates the wire support hole 6a, and the bonding wire 5 is supported so that the ball portion 5b comes to the side of the alloy pad 3.

In a case of performing ultrasonic bonding in the construction described above, initially the capillary tool 6 supporting the wire portion 5a of the bonding wire 5 is positioned on the alloy pad 3 under a room temperature condition, or a condition in which the bonding junction region is heated to 200° C., and the ball portion 5b of the bonding wire 5 is in contact with the surface of the alloy pad 3.

Then, ultrasonic vibration is applied to the capillary tool 6 to vibrate the tip end of the capillary tool 6, and the tip end of the capillary tool 6 is pushed against the side of the alloy pad 3 while the ultrasonic vibration is being applied to the capillary tool 6 to cause a load to be applied onto the surface of the alloy pad 3 by the ball portion 5b.

At this time, the alloy pad 3 is metallurgically bonded at the interface between the aluminum-silicon-copper (Al—Si—Cu) alloy forming the alloy pad 3 and the gold (Au) of the ball 5b by the pressure applied by the vibrating ball 5b. Thereby, desired ball bonding is performed and the bonding wire 5 is firmly bonded to the alloy pad 3 through ultrasonic bonding.

Therein, the bonding wire 5 used in the ultrasonic bonding method according to the present invention is composed of the wire portion 5a of 30 μm diameter and the ball portion 5b of 65 μm diameter. When the film thickness H of the alloy pad 3 is, for example, 0.8 μm, the ultrasonic vibration applied to the tip end of the capillary tool 6 is selected so that the vibration frequency is 180 kHz, the vibration output electric power is 0.1 W and the vibration amplitude is 0.3 μm.

In the ultrasonic bonding method of this embodiment, the vibration frequency and the vibration amplitude of the ultrasonic vibration applied to the tip end of the capillary tool 6 are selected as described above. The technical reason for the selection will be described below.

In a case where a gold (Au) bonding wire 5 having a wire porion 5a of nearly 30 μm diameter is bonded to an alloy pad 3 through ultrasonic bonding under a condition of heating the bonding junction region using the ultrasonic bonding apparatus in the prior art, the ultrasonic vibration applied to the capillary tool 6 is selected so that the vibration amplitude in a no-load condition becomes 2 μm to 3 μm when the ultrasonic frequency is selected to be 60 kHz, and the vibration amplitude in a no-load condition becomes 1 μm to 2 μm when the ultrasonic frequency is selected to be 120 kHz.

The reason why such a selection is performed in the ultrasonic bonding apparatus in the prior art is as follows. The vibration amplitude of the tip end of the capillary tool 6 is reduced during bonding due to an increase in the load, and consequently the bonding strength of the bonding wire 5 which has been bonded by ultrasonic bonding is decreased.

In order to prevent such a decrease in the bonding strength, the ultrasonic vibration input to the capillary tool 6 is selected to have such a comparatively large input condition that the vibration amplitude of the tip end of the capillary tool 6 may be maintained to a desired value when the ultrasonic bonding proceeds and the load on the capillary tool 6 is accordingly increased.

However, if the ultrasonic vibration input to the capillary tool 6 is set to a comparatively large value, the vibration amplitude of the tip end of the capillary tool 6 becomes excessively large because the load on the capillary tool 6 is small at the initial stage of the ultrasonic bonding.

If the large vibration amplitude of the tip end of the capillary tool 6 is applied to the ultrasonic bonding junction region, a large force acts on a portion beneath the bonding junction region to cause a physical damage in the alloy pad 3, the silicon dioxide (SiO$_2$) insulation film 2 and the silicon (Si) substrate 1.

Further, in a case where silicon (Si) nodules are formed in the alloy pad 3, a large local stress is applied to the portion near the silicon (Si) nodules to substantially increase the probability of occurrence of physical damage, as described above.

Figure 2:
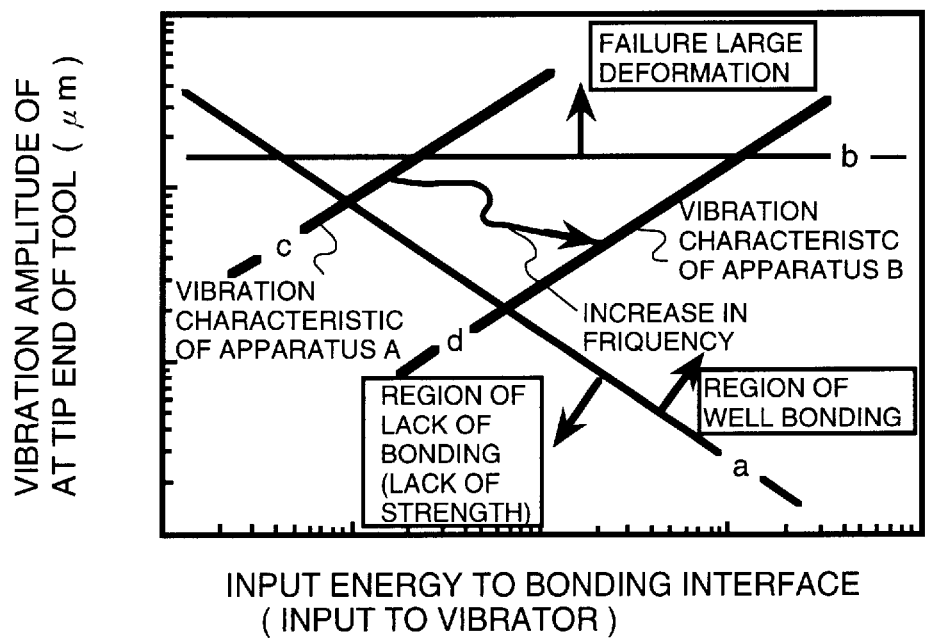
FIG. 2 is a characteristic graph showing a relationship between energy input into a bonding junction region for ultrasonic bonding (input electric power to an ultrasonic vibrator) and the vibration amplitude of a tip end of a capillary tool, and the bonding strength of the ultrasonic bonding.

FIG. 2 is a characteristic graph showing the relationship among the energy input into a bonding junction region for ultrasonic bonding (input electric power to the ultrasonic vibrator for effecting vibration of the capillary tool 6 at an ultrasonic frequency) and the vibration amplitude of the tip end of a capillary tool 6 and the bonding strength produced by the ultrasonic bonding.

In FIG. 2, the ordinate indicates the vibration amplitude of the tip end of a capillary tool 6 expressed as units of $\mu$m and the abscissa indicates the energy input into a bonding junction region for the ultrasonic bonding (the electric power input to the ultrasonic vibrator).

In FIG. 2, the characteristic curve a is a boundary line between regions indicating whether the bonding state is good or bad; the characteristic curve b is a boundary line between regions indicating whether physical damage which has occurred in a portion beneath the alloy pad 3 is allowable or not; the characteristic curve c is a straight line indicating the vibration characteristic of an ultrasonic bonding apparatus A; and the characteristic curve d is a straight line indicating the vibration characteristic of an ultrasonic bonding apparatus B.

According to studies of the inventors of the present invention, it has been theoretically determined that there exists the relationships shown in FIG. 2 among the vibration amplitude of the tip end of the capillary tool 6, the energy input into a bonding junction region for the ultrasonic bonding and the bonding strength produced by the ultrasonic bonding.

That is, the condition for obtaining a necessary bonding strength in the ultrasonic bonding is that the acceptable vibration amplitude of the tip end of the capillary tool 6 becomes smaller as the input energy into a bonding junction region is increased, as shown by the characteristic curve a (the region in the upper side of the characteristic curve a).

Occurrence of physical damage in the ultrasonic-bonding steeply increases when the vibration amplitude of the tip end of the capillary tool 6 exceeds a certain value, as shown by the characteristic curve b (the region in the upper side of the characteristic curve b).

In regard to the relationship between the two ultrasonic bonding apparatuses A and B having different frequencies of ultrasonic vibration (the frequency of the apparatus A<the frequency of the apparatus B), the levels of electric power input to the ultrasonic vibrator (the input energies into the bonding junction region) have a certain correlation under a constant environmental condition, as shown by the characteristic curves c and d.

In both ultrasonic bonding apparatuses A and B, the vibration amplitudes of the tip end of a capillary tool 6 increase in a parallel relationship to each other in proportion to an increase in the levels of the electric power input to the ultrasonic vibrator.

In this case, in comparing the characteristic curves for the two ultrasonic bonding apparatuses A and B, the region for the condition in which a good bonding strength is obtainable is wider for apparatus B, since the characteristic curve d exists farther to the right side of the line a in FIG. 2. Therefore, a higher vibration frequency is preferable.

Based on the above facts, the inventors of the present invention have specified the condition for an ultrasonic bonding apparatus as follows.

In regard to the vibration characteristic of the ultrasonic bonding apparatus, the vibration amplitudes of the tip end of the capillary tool 6 is selected so as to be a fraction to one-tenth as small as the vibration amplitudes of the tip end of the capillary tool 6 in the conventional ultrasonic bonding apparatus, and the frequency of the ultrasonic vibration is selected so as to be higher than the vibration frequency in the conventional ultrasonic bonding apparatus.

More particularly, the vibration amplitude of the tip end of the capillary tool 6 is selected so as to be smaller than the film thickness H of the alloy pad 3 and the frequency of the ultrasonic vibration is selected so as to be above 70 kHz.

Figure 3:
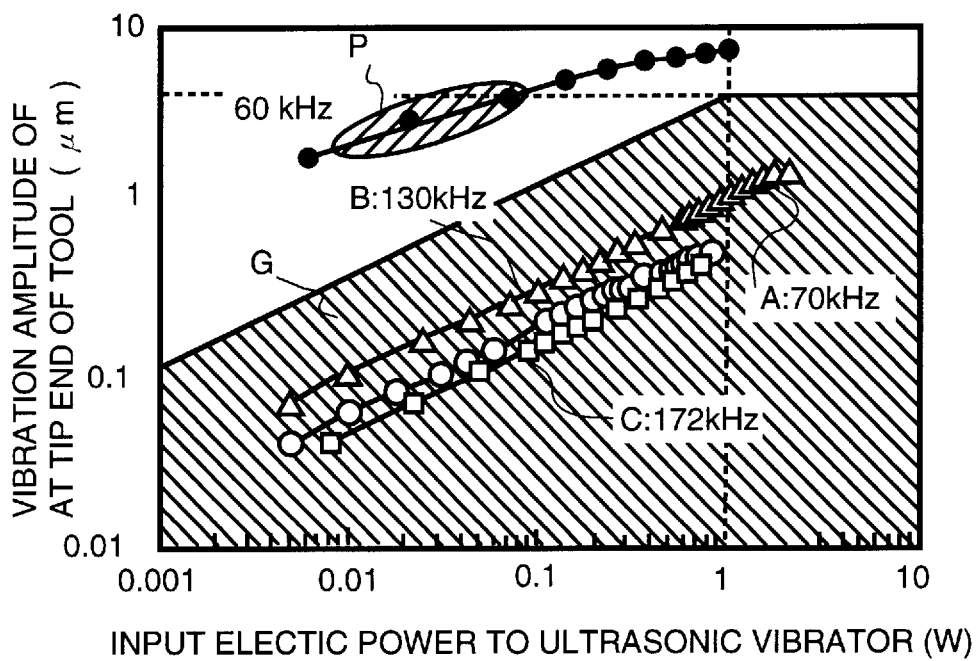
FIG. 3 is a characteristic graph showing a region of required condition for an ultrasonic bonding apparatus in accordance with the present invention, which is obtained on the basis of a relationship between electric power input to an ultrasonic vibrator of an ultrasonic bonding apparatus and the vibration amplitude of a tip end of a bonding tool under a no-load condition.

FIG. 3 is a characteristic graph showing a region of a required condition for an ultrasonic bonding method and an ultrasonic bonding apparatus in accordance with the present invention, to be described below, which is obtained based on the relationship between the electric input power to the ultrasonic vibrator of the ultrasonic bonding apparatus and the vibration amplitude A of the tip end of the bonding tool under a no-load condition.

In FIG. 3, the abscissa indicates the electric power E input to the ultrasonic vibrator expressed in units of Watts (w) and the ordinate indicates the vibration amplitude A of the tip end of a bonding tool under a no-load condition expressed in units of micro-meters ($\mu$m).

The region G cross-hatched with lines inclining toward the lower-right side is the region of the required condition for the ultrasonic bonding method or the ultrasonic bonding apparatus in accordance with the present invention, and the elliptical region P cross-hatched with lines inclining toward the upper-right side is the region of the required condition for the conventional ultrasonic bonding method or the conventional ultrasonic bonding apparatus.

As shown in FIG. 3, the region G of the required condition for the ultrasonic bonding method or the ultrasonic bonding apparatus in accordance with the present invention is composed of a first rectangular region specified by the range of the electric power input to the ultrasonic vibrator of 0.001 to 10 (W) and the range of the vibration amplitude A of the tip end of a bonding tool under a no-load condition of 0.01 to 0.1 ($\mu$m), a second right-angular triangular region specified by the range of the electric power input to the ultrasonic vibrator of 0.001 to 1.0 (W) and the linearly increasing range of the vibration amplitude A of the tip end of a bonding tool under a no-load condition from 0.1 to 4.0 ($\mu$m), and a third rectangular region specified by the range of the electric power input to the ultrasonic vibrator of 1.0 to 10.0 (W) and the range of the vibration amplitude A of the tip end of a bonding tool under a no-load condition of 0.1 to 4.0 ($\mu$m).

In the region G, the relationship between the electric power E input to the ultrasonic vibrator and the vibration amplitude A of the tip end of a bonding tool under a no-load condition is expressed by the characteristic curve A when the vibration frequency of the ultrasonic vibrator is 70 kHz, by the characteristic curve B when the vibration frequency of the ultrasonic vibrator is 130 kHz, and by the characteristic curve c when the vibration frequency of the ultrasonic vibrator is 172 kHz.

When the characteristic curves A to C are expressed in a logarithmic domain as the relationship between the input electric power E and the vibration amplitude A, each of the gradients of the characteristic curves log E/log A becomes (1.6)/3, that is, the relationships can be expressed by lines of log E/log A=(1.6)/3, respectively.

Therefore, the gradient of the side opposite to the right angle in the second region of the right-angular triangle in the region G of the required condition becomes a straight line having a gradient of approximately log E/log A=(1.6)/3.

On the other hand, when the vibration frequency of the ultrasonic vibrator is selected to be 60 kHz, as in the conventional ultrasonic bonding method or in the conventional ultrasonic bonding apparatus, the region P of the required condition is the elliptic region P shown in FIG. 3.

In this case, the relationship between the electric power E input to the ultrasonic vibrator and the vibration amplitude A of the tip end of a bonding tool under a no-load condition is expressed by the characteristic curve D.

Although the characteristic curve D has a gradient similar to those of the three characteristic curves A to C in the region G, the range of the electric power E input to the ultrasonic vibrator contained in the region P is extremely narrow compared to the range of the electric power E input to the ultrasonic vibrator contained in the region G in accordance with the present invention.

In addition to this, not only is the range of the vibration amplitude A of the tip end of a bonding tool under a no-load condition as contained in the region P extremely narrow as compared to the vibration amplitude A of the tip end of a bonding tool under a no-load condition contained in the region G in accordance with the present invention, but also the required magnitude of the vibration amplitude A is significantly high.

Figure 4:
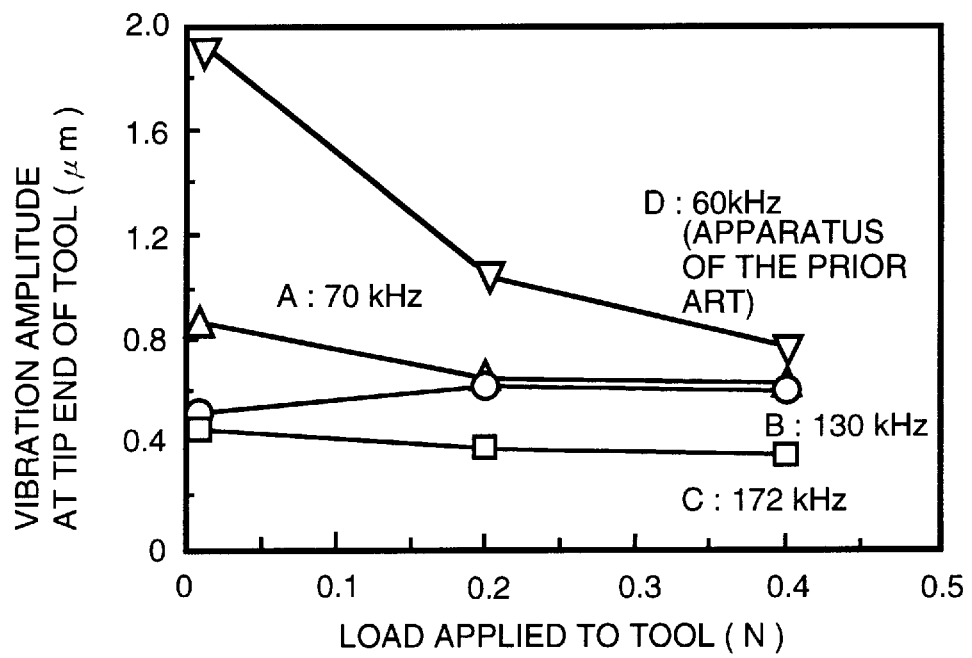
FIG. 4 is a characteristic graph showing a relationship between the load applied to a bonding tool and the vibration amplitude of a tip end of a bonding tool under a no-load condition.

FIG. 4 is a characteristic graph showing the relationship between the load M applied to a bonding tool and the vibration amplitude A of the tip end of a bonding tool under a no-load condition when taking the vibration frequencies of the ultrasonic vibrator as parameters.

In FIG. 4, the ordinate indicates the load M applied to a bonding tool expressed in units of Newtons (N) and the abscissa indicates the vibration amplitude A of the tip end of a bonding tool under a no-load condition expressed in units of micro-meters ($\mu$m).

The characteristic curves A to C show the characteristics of the ultrasonic bonding method or the ultrasonic bonding apparatus in accordance with the present invention and the characteristic curve D shows the characteristic of the conventional ultrasonic bonding method or the conventional ultrasonic bonding apparatus.

As shown in FIG. 4, the conventional ultrasonic bonding method or the conventional ultrasonic bonding apparatus operating at an ultrasonic vibrator frequency of 60 kHz is required to set the vibration amplitude A of the tip end of a bonding tool under a no-load condition to a substantially large value (characteristic curve D).

However, in the ultrasonic bonding method or the ultrasonic bonding apparatus in accordance with the present invention, which employs an ultrasonic vibrator frequency of 70 kHz, 130 kHz or 172 kHz, the vibration amplitude A of the tip end of a bonding tool under a no-load condition is acceptable even when the load M applied to a bonding tool is comparatively small (characteristic curves A to C).

Therefore, in the ultrasonic bonding method or the ultrasonic bonding apparatus in accordance with the present invention, attenuation of the vibration amplitude is very small independent of the magnitude of the load.

Figure 5:
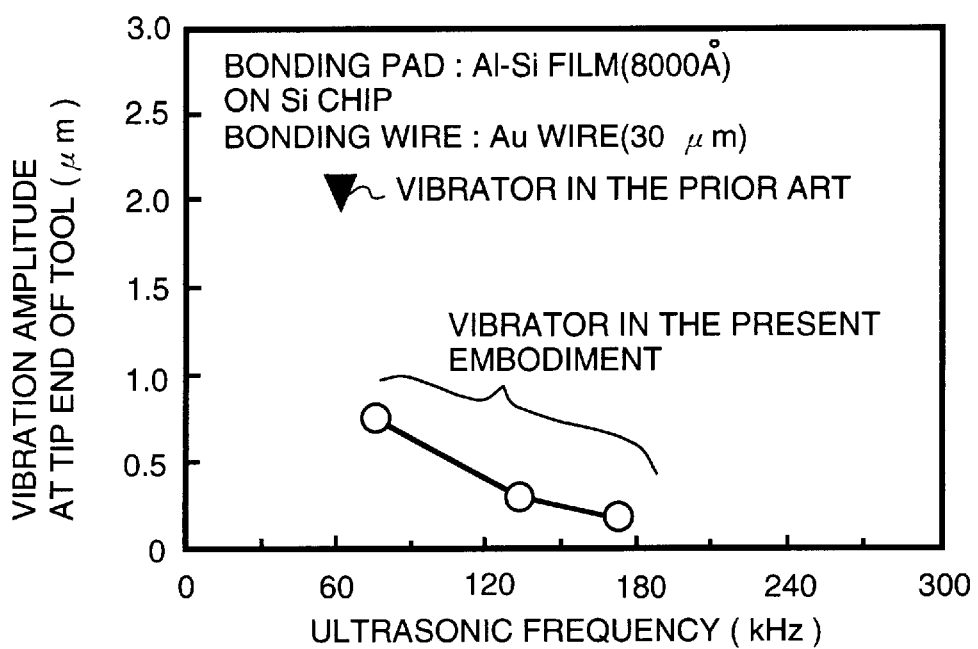
FIG. 5 is a characteristic graph showing a relationship between the vibration frequency of an ultrasonic vibrator capable of obtaining a shear stress of 0.3 Newton (N) at a ball portion and the vibration amplitude A of a tip end of a bonding tool under a no-load condition in a case of performing ultrasonic ball bonding.

FIG. 5 is a characteristic graph showing the relationship between the vibration frequency of the ultrasonic vibrator capable of obtaining a shear stress of 0.3 Newton (N) at the ball portion 5b and the vibration amplitude A of the tip end of the bonding tool under a no-load condition in a case of performing ultrasonic ball bonding.

In FIG. 5, the abscissa indicates the vibration frequency of the ultrasonic vibrator expressed in units of kilo-Hertz (kHz) and the ordinate indicates the vibration amplitude A of the tip end of a bonding tool under a no-load condition expressed in units of micro-meters ($\mu$m).

The curves show the characteristics capable of obtaining a shear stress of 0.3 Newton (N) at a ball portion 5b when a gold (Au) bonding wire 5 is ball-bonded to an aluminum-silicon (Al—Si) alloy pad 3 having a film thickness of 8000 Å (0.8 $\mu$m) provided on a silicon (Si) substrate.

As shown in FIG. 5, in the conventional ultrasonic bonding method or the conventional ultrasonic bonding apparatus wherein the vibration frequency of the ultrasonic vibrator is 60 kHz, the vibration amplitude A of the tip end of a bonding tool under a no-load condition is approximately 2.0 $\mu$m.

However, in the ultrasonic bonding method or the ultrasonic bonding apparatus in accordance with the present invention using an ultrasonic vibrator frequency of 70 kHz, 130 kHz or 172 kHz, the vibration amplitude A of the tip end of a bonding tool under a no-load condition is smaller than 0.8 $\mu$m, which is the thickness of the alloy pad.

That is, it can be understood that in the ultrasonic bonding method or the ultrasonic bonding apparatus in accordance with the present invention, the bonding strength required for proper bonding can be obtained even if the vibration amplitude A of the tip end of a bonding tool under a no-load condition is smaller than 0.8 $\mu$m, which is the thickness of the alloy pad.

Further, ultrasonic bonding has been performed using the ultrasonic bonding method or the ultrasonic bonding apparatus in accordance with the present invention wherein the vibration frequency of the ultrasonic vibrator was 70 kHz, 130 kHz or 172 kHz, after which an inspection was conducted to determine the presence of physical damage in the silicon dioxide ($SiO_2$) insulator film 2 beneath the alloy pad 3 using a scanning electron microscope after corrosively removing the alloy pad 3.

However, no physical damage could be observed. This revealed that the ultrasonic bonding method or the ultrasonic bonding apparatus in accordance with the present invention can prevent the occurrence of physical damage in the layer 2 beneath the alloy pad 3.

As described above, according to the ultrasonic bonding method of this embodiment, the vibration amplitude A of the tip end of a bonding tool under a no-load condition can be smaller than the vibration amplitude A of the tip end of a bonding tool under a no-load condition in the conventional ultrasonic bonding method, and particularly, it can be smaller than the film thickness H of the alloy pad (metallic pad) 3.

Further, the vibration frequency of the ultrasonic vibrator can be higher than the vibration frequency of the ultrasonic vibrator in the conventional ultrasonic bonding method, and particularly, bonding having a sufficient strength above a shear stress of 0.3 Newton tN) can be obtained by setting the vibration frequency of the ultrasonic vibrator to above 70 kHz.

Furthermore, during bonding, the ultrasonic bonding method of this embodiment can prevent the occurrence of physical damage in the layer beneath the alloy pad (metallic pad) 3.

Figure 6:
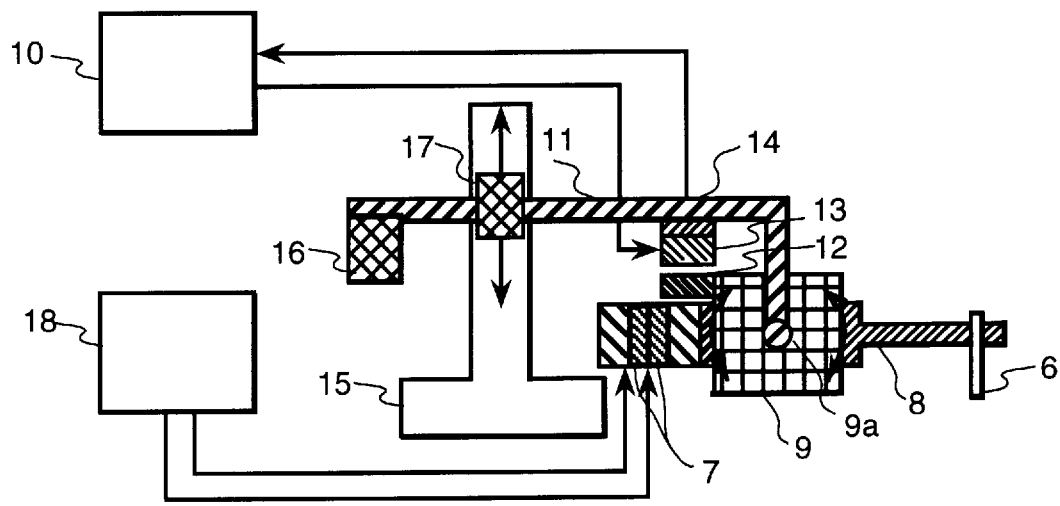
FIG. 6 is a schematic diagram showing a first embodiment of an ultrasonic bonding apparatus in accordance with the present invention.

FIG. 6 is a schematic diagram showing a first embodiment of an ultrasonic bonding apparatus in accordance with the present invention, and also showing the essential structural portion of the ultrasonic bonding apparatus in accordance with the present invention.

Referring to FIG. 6, the ultrasonic bonding apparatus is composed of a Langevin type piezoelectric device (vibrator) 7 for generating an ultrasonic vibration having a vibration frequency of 180 kHz, a titanium (Ti) horn 8, a rotating jig 9, a shaft axis 9a, a feedback control circuit 10, a support arm 11, a magnetic member 12, an electromagnet 13, a pressure sensor 14, a base 15, a balancing weight 16, a sliding jig 17, and an ultrasonic generator driving circuit 18. The other structural parts are the same structural parts as shown in FIG. 1 and are identified by the same reference characters.

The rotating jig 9 is rotatable around the shaft axis 9a and the horn 8 is attached to one side surface of the rotating jig and the Langevin type piezoelectric device 7 is attached to the other side surface of the rotating jig.

The horn 8 is of a thin and long shape, and the capillary tool (bonding tool) 6 is attached to one end of the horn and the rotating jig 9 is attached to the other end of the horn. The support arm 11 has an L-shape and is supported by the base 15, and the shaft axis 9a of the rotating jig 9 is jointed to one end portion of the support arm 11 and the balancing weight 16 is attached to the other end portion of the support arm 11.

The magnetic member 12 is attached to the rotating jig 9 so as to be arranged in the upper side portion of the ultrasonic vibrator 7, and the electromagnet 13 and the pressure sensor 14 are overlapped with each other and are attached to the support arm 11 so as to face the magnetic member 12. The input port of the feedback control circuit 10 is connected to the pressure sensor 14 and the output port is connected to the electromagnet 13, and the ultrasonic generator driving circuit 18 is connected to the Langevin type piezoelectric device 7.

When ultrasonic bonding is performed using this ultrasonic bonding apparatus, a bonding junction region is brought to a room temperature condition or a heating condition at 200° C., and the bonding wire 5 (not shown) is inserted into and supported by the wire support hole 6a (not shown) of the capillary tool 6.

Then, after the bonding wire 5 is positioned above the alloy pad 3 (not shown) to be bonded by moving the capillary tool 6, the capillary tool 6 is slightly moved downward to cause the ball portion 5b (not shown) of the bonding wire 5 to contact the alloy pad 3.

During operation of the capillary tool 6, the ultrasonic generator driving circuit 18 supplies driving electric power to the Langevin type piezoelectric device 7 to cause the Langevin type piezoelectric device 7 to generate an ultrasonic vibration having an vibration frequency of 180 kHz.

At this time, the generated ultrasonic vibration is transmitted to the capillary tool 6 from the rotating jig 9 through the horn 8, and is further transmitted to the ball portion 5b contacting the alloy pad 3 to oscillate the ball portion 5b while the ball portion is in contact with the alloy pad 3. Then, the feedback control circuit 10 supplies current to the electromagnet 13 to attract the magnetic member 12 with a generated electromagnetic force.

As the magnetic member 12 is attracted to the electromagnet 13, the rotating jig 9 is slightly rotated around the shaft axis 9a in the clockwise direction, and the capillary tool 6 is moved clockwise (in the alloy pad direction) together with the horn 8 to bring the ball portion 5b in the state where a load is applied to the alloy pad 3 through the capillary tool 6, that is, in a state where a load is applied to the capillary tool 6.

Metallic bonding is caused between the ball portion 5b and the alloy pad 3 by effecting strong contact between the ball portion 5b so that the ultrasonic vibration and the load are applied to the alloy pad 3, and consequently the bonding wire 5 is bonded to the alloy pad 3.

On the other hand, the load acting on the capillary tool 6 is detected by the pressure sensor 14 attached to the support arm 11, and the detected load signal is supplied to the feedback control circuit 10. The feedback control circuit 10 judges whether the input value of the load signal agrees with a preset value set internally.

If there is any difference, the feedback control circuit 10 performs to control so that the load acting on the capillary tool 6 becomes equal to the preset value by supplying current to the electromagnet 13 so as to compensate for any difference.

In this case, the first embodiment of the ultrasonic bonding apparatus controls the electric power input to the Langevin type piezoelectric device 7 so as to come into the region G shown in FIG. 3.

That is, the ultrasonic bonding apparatus controls the electric power input to the Langevin type piezoelectric device 7 so as to cause the operation to come into the region where the vibration amplitude of the tip end of the capillary tool 6 under a no-load condition is within the range of 0.01 to 0.1 ($\mu$m) when the electric power input to the Langevin type ultrasonic piezoelectric device 7 is within the range of 0.001 to 10 (W), so that the vibration amplitude of the tip end of the capillary bonding tool 6 under a no-load condition from 0.1 to 4.0 ($\mu$m) linearly increases when the electric power input to the Langevin type ultrasonic piezoelectric device 7 is within the range of 0.001 to 1.0 (W), and the vibration amplitude of the tip end of the capillary tool 6 under a no-load condition is within the range of 0.1 to 4.0 ($\mu$m) when the electric power input to the Langevin type ultrasonic piezoelectric device 7 is within the range of 1.0 to 10.0 (W).

As described above, according to the first embodiment, the range of the electric power input to the Langevin type piezoelectric device 7 can be largely expanded in comparison to the range of the electric power input in the conventional ultrasonic bonding apparatus, and the vibration amplitude of the tip end of the capillary tool 6 under a no-load condition can be substantially decreased in comparison to the vibration amplitude of the tip end of the capillary tool 6 under a no-load condition in the conventional ultrasonic bonding apparatus.

Therefore, the occurrence of physical damage in the portion beneath the alloy pad 3 can be prevented in the first half of the bonding operation, and a high strength bonding can be performed by applying a proper magnitude of vibration in the latter half of the bonding operation. That is, it is possible to bond the wire to the metal pad of the semiconductor substrate with low physical damage and with high strength.

As a result, in the manufacturing of semiconductor devices, the production yield of the semiconductor devices in the following process can be improved and accordingly the production cost of the semiconductor devices can be reduced.

Figure 7:
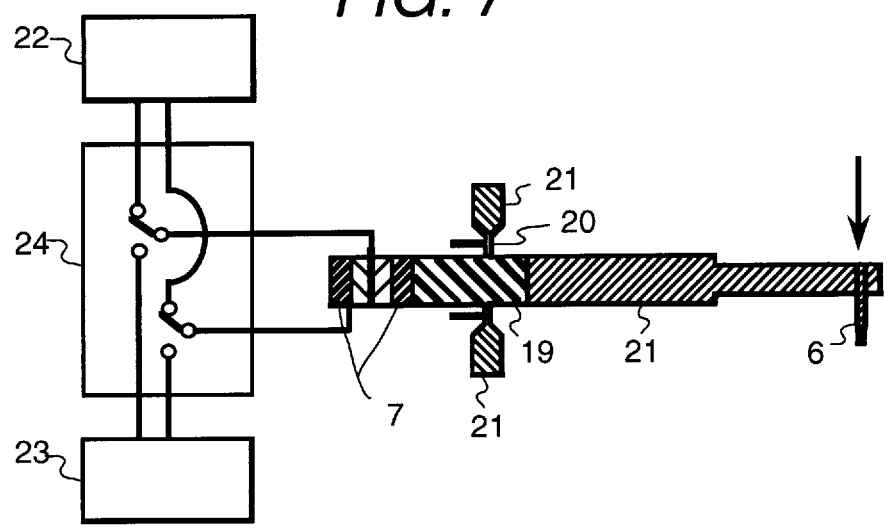
FIG. 7 is a schematic diagram showing a second embodiment of an ultrasonic bonding apparatus in accordance with the present invention.

FIG. 7 is a schematic view showing a second embodiment of an ultrasonic bonding apparatus in accordance with the present invention, the figures also showing the essential structural portion of the ultrasonic bonding apparatus in accordance with the present invention.

Referring to FIG. 7, the ultrasonic bonding apparatus is composed of a vibration transmission member 19, a flange 20, a support member 21, a first vibrator driving circuit 22 having a 120 kHz frequency, a second vibrator driving circuit 23 having 60 kHz frequency, and a switching circuit 24. The other structural parts are the same structural parts as shown in FIG. 6 and are identified by the same reference characters.

The vibration transmission member 19 is a long structural member as seen in the lateral direction and is supported by the support member 21 through the flange 20. The horn 8 is attached at one end of the vibration transmission member 19 and the Langevin type piezoelectric device (vibrator) 7 is attached at the other end of the vibration transmission member 19.

The input ports of the switching circuit 24 are connected to the first vibrator driving circuit 22 and the second vibrator driving circuit 23, and the output port of the switching circuit 24 is connected to the Langevin type piezoelectric device 7.

In the above construction, in a case of performing ultrasonic bonding where there is a comparatively large possibility of causing physical damage to the portion beneath the alloy pad, the switching circuit 24 is switched to the first vibrator driving circuit 22 and the Langevin type piezoelectric device 7 is driven by electric power supplied from the first vibrator driving circuit 22 to generate an ultrasonic vibration having a frequency of 120 kHz from the Langevin type piezoelectric device 7.

The ultrasonic vibration is transmitted to the capillary tool 6 through the vibration transmission member 19 and the horn 8 and is then transmitted to the ball portion 5a (not shown) of the bonding wire 5 supported by the capillary tool 6. At this time, the ultrasonic vibration and a load are applied to the ball portion 5a of the bonding wire 5 and the bonding wire 5 is bonded to the alloy pad 3 through ultrasonic bonding, as described above.

In this case, the electric power input to the Langevin type piezoelectric device 7 is adjusted to, for instance, 0.1 W, and the vibration amplitude of the tip end of the bonding tool under a no-load condition is adjusted to, for instance, 0.2 $\mu$m.

On the other hand, when performing ultrasonic bonding where there is a small possibility of causing physical damage to the portion beneath the alloy pad, the switching circuit 24 is switched to the second vibrator driving circuit 23 and the Langevin type piezoelectric device 7 is driven by electric power supplied from the second vibrator driving circuit 23 to generate an ultrasonic vibration having a frequency of 60 kHz from the Langevin type piezoelectric device 7.

The ultrasonic vibration is transmitted to the capillary tool 6 through the vibration transmission member 19 and the horn 8 and then is transmitted to the ball portion 5a of the bonding wire 5 supported by the capillary tool 6. At this time, the ultrasonic vibration and the load are applied to the ball portion 5b of the bonding wire 5, and the bonding wire 5 is bonded to the alloy pad 3 through ultrasonic bonding, as described above.

In this case, the electric power input to the Langevin type piezoelectric device 7 is adjusted to, for instance, 0.1 W as in the above case, but the vibration amplitude of the tip end of a bonding tool under a no-load condition is adjusted to a larger amplitude of, for instance, 2.5 $\mu$m.

Figure 8:
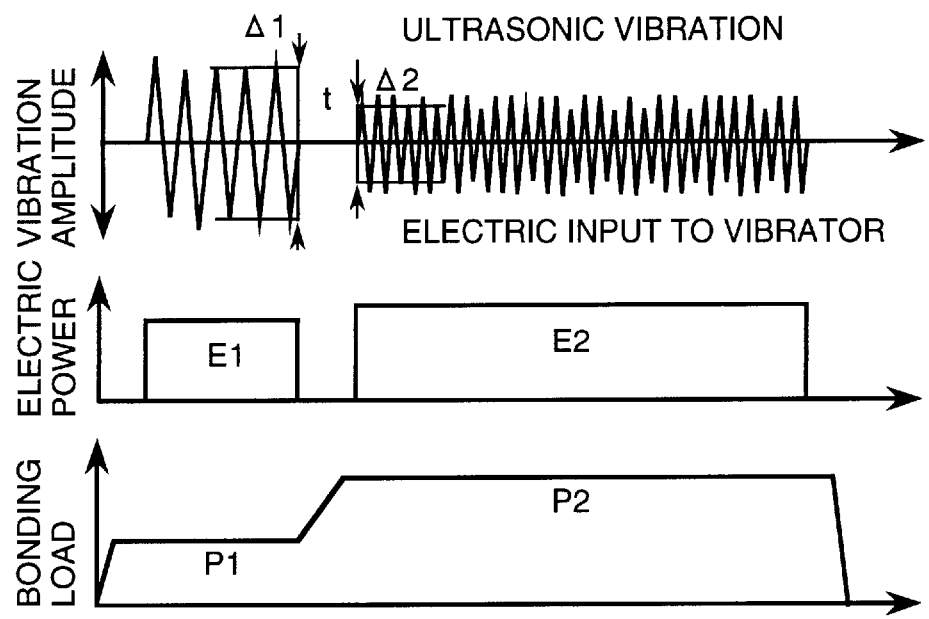
FIG. 8 is a chart showing an example of various characteristics of the second embodiment.

FIG. 8 is a chart showing an example of the characteristics of the second embodiment. FIG. 8 shows a time-varying state of a vibration frequency generated by a Langevin type piezoelectric device, a time-varying state of the electric power input to the Langevin type piezoelectric device, and a time-varying state of load applied to a capillary tool.

These characteristics are obtained from an operating state where a gold (Au) bonding wire 5 having a 30 $\mu$m diameter is ball-bonded to an aluminum-silicon-copper (Al—Si—Cu) alloy pad 3 having a 6000 Å (0.6 $\mu$m) thickness formed on a silicon (Si) substrate 1, and the temperature of the bonding junction region is set to 200° C.

As shown in FIG. 8, when the bonding wire 5 is ball-bonded to the alloy pad 3, in the first bonding period at the initial stage of bonding, ultrasonic bonding, which is the same as described above, is performed by applying a load M1 to the capillary tool 6 to a value of 0.1 Newton (N) and by switching the switching circuit 24 to the second vibrator driving circuit 23 to drive the Langevin type piezoelectric device 7 with a low input electric power E1 lower than 0.05 mW, and by generating an ultrasonic vibration at a frequency of 60 kHz having a comparatively large amplitude from the Langevin type piezoelectric device 7.

Then, in the second bonding period at the latter stage of bonding, ultrasonic bonding, which is the same as described above, is performed by applying the load M2 to the capillary tool 6 to a value of 0.3 Newton (N) larger than the above load M1, and by switching the switching circuit 24 to the first vibrator driving circuit 22 to drive the Langevin type piezoelectric device 7 with a slightly larger input electric power E2, and by generating ultrasonic vibration at a frequency of 120 kHz having a small amplitude from the Langevin type piezoelectric device 7.

According to this embodiment, with such ultrasonic bonding, in the first bonding period, an oxide film formed on the surface of the alloy pad 3 can be removed by the ball portion 5b by setting the load M1 applied to the capillary tool 6 to a small value and by setting the amplitude of the ultrasonic vibration of 60 kHz as applied to the bonding junction region to a large value.

Then, in the following second bonding period, ultrasonic bonding can be performed without producing any physical damage in the portion beneath the alloy pad 3 by setting the load M2 applied to the capillary tool 6 to a slightly large value and by setting the amplitude of the ultrasonic vibration of 120 kHz applied to the bonding junction region to a small value.

According to this second embodiment, when the oxide film is being removed in the second bonding period, the metallic bonding between the alloy pad 3 and the ball portion 5b is made firm and consequently it is possible to produce a highly reliable and strong bonding.

In the ultrasonic bonding apparatuses of the first embodiment and the second embodiment, the value of the electric power E input to the Langevin type piezoelectric device 7 and the value of the vibration amplitude A of the tip end of the capillary tool 6 are not limited to the specific values described herein, but they may be selected from values within the region G shown in FIG. 3.

That is, they may be selected so that the vibration amplitude A of the tip end of the capillary tool 6 under a no-load condition is within the range of 0.01 to 0.1 ($\mu$m) when the electric power E input to the Langevin type ultrasonic piezoelectric device 7 is within the range of 0.001 to 10 (W), the vibration amplitude A of the tip end of the capillary bonding tool 6 under a no-load condition is in the range linearly increasing from 0.1 to 4.0 ($\mu$m) when the electric power E input to the Langevin type ultrasonic piezoelectric device 7 is within the range of 0.001 to 1.0 (W), and the vibration amplitude A of the tip end of the capillary tool 6 under a no-load condition is within the range of 0.1 to 4.0 ($\mu$m) when the electric power E input to the Langevin type ultrasonic piezoelectric device 7 is within the range of 1.0 to 10.0 (W).

When the load applied to the capillary tool 6 during bonding is within 10 Newtons (N), it is preferable for the vibration amplitude A of the tip end of the capillary bonding tool 6 to be selected so as to become more than one-half of the vibration amplitude A of the tip end of the capillary bonding tool 6 under a no-load condition.

It is also preferable for the vibration frequency of the ultrasonic vibration generated by the Langevin type piezoelectric device 7 to be above 100 kHz and the vibration of the tip end of the capillary tool 6 to be selected so that the relationship between the vibration amplitude A under a no-load condition and the vibration frequency f (kHz) satisfies the condition $\log A \geq -0.31 \times \log f^2 + 1.414$.

Figure 9:
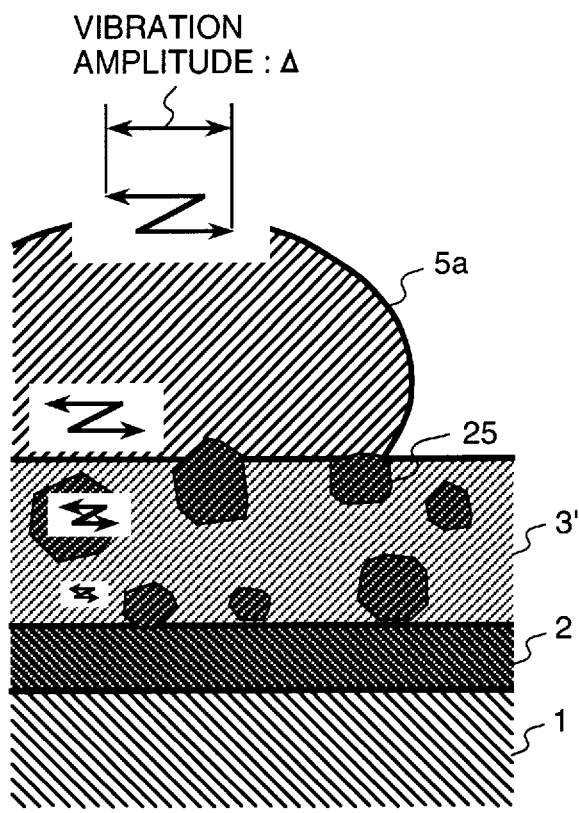
FIG. 9 is an explanatory diagram showing an attenuating state of an ultrasonic vibrator in a case where silicon (Si) nodules exist in an alloy pad.

FIG. 9 is an explanatory view showing an attenuating state of ultrasonic vibration in a case where silicon (Si) nodules exist in an alloy pad, for example, in an aluminum-silicon (Al—Si) alloy pad, and is also a cross-sectional view showing the structure of a bonding junction region.

Referring to FIG. 9, the reference character 3' denotes an aluminum-silicon (Al—Si) alloy pad, and the reference character 25 denotes a silicon (Si) nodule. The other structural parts are the same structural parts shown in FIG. 1 and are identified by the same reference characters.

As shown in FIG. 9, ultrasonic vibration supplied to the position near the tip end portion of the gold (Au) ball portion 5b is transmitted inside the ball portion 5b while the ultrasonic vibration is being slightly attenuated, and reaches the junction point of the ball portion 5b and the alloy pad 3'.

Here, the ultrasonic vibration is transmitted from the ball portion 5b to the alloy pad 3' and passes mainly inside or near the silicon (Si) nodules 25 and is transmitted inside the alloy pad 3', while the ultrasonic vibration is being attenuated, and reaches the junction region of the alloy pad 3' and the silicon dioxide ($SiO_2$) insulator film 2.

Then, the ultrasonic vibration is transmitted inside the insulator film 2 from the alloy pad 3' and is transmitted inside the insulator film, while the ultrasonic vibration is being slightly attenuated and reaches the junction region of the insulator film 2 and the silicon (Si) substrate 1, and then is transmitted inside the substrate in the same manner as described above.

In each of the ultrasonic bonding method and the ultrasonic bonding apparatus in accordance with the present invention, when an ultrasonic vibration is transmitted to the ball portion 5b from the capillary tool 6, the ultrasonic vibration is attenuated first inside the ball portion 5b and later at the junction region of the ball portion 5b and the alloy pad 3'.

In this case, when the vibration amplitude of the ultrasonic vibration at the tip end of the ball portion 5b (initial vibration amplitude) is compared with the amplitude of the ultrasonic vibration inside the alloy pad 3', the amplitude of the ultrasonic inside the alloy pad 3' is substantially attenuated compared to the initial vibration amplitude and is actually reduced to a fraction of the film thickness of the alloy pad 3' due to attenuation of the ultrasonic vibration inside the ball portion 5b and at the junction region of the ball portion 5b and the alloy pad 3'.

According to each of the embodiments which have been described above, although stress is concentrated at portions around the silicon (Si) nodules 25 inside the alloy pad 3' (3) during ultrasonic bonding when silicon (Si) nodules 25 exist inside the alloy pad 3' (3), the magnitude of the maximum stress is sufficiently low compared to that produced in the conventional ultrasonic method or the conventional ultrasonic apparatus.

Therefore, it is possible to substantially reduce the probability of occurrence of cracks or micro-cracks in the silicon dioxide ($SiO_2$) insulator film 2 in the portion beneath the alloy pad 3' (3), and accordingly it is possible to reduce the probability of occurrence of physical damage in the portion of the silicon dioxide ($SiO_2$) insulator film 2 beneath the alloy pad 3' (3).

As described in detail above, according to the ultrasonic bonding method of the present invention, ultrasonic bonding is performed by setting the vibration amplitude of the tip end of the bonding tool of the ultrasonic bonding apparatus to a value smaller than the film thickness of the metal pad and setting the vibration frequency to a value higher than 70 kHz, which is higher than the vibration frequency of 60 kHz in the prior art, under a room temperature condition to a heating condition at a temperature below 200° C.

Therefore, there is an effect in that a large shear stress or a large pressure strain acts to a lesser extent not only on the metal pad, but also on the insulator film or the semiconductor substrate under the metal pad, during ultrasonic bonding, and accordingly the probability of occurrence of fine physical failures, such as micro-cracks or cracks, in the metal pad itself or in the insulator film or the semiconductor substrate under the metal pad is substantially reduced and degradations in various kinds of characteristics of the semiconductor device after ultrasonic bonding can be prevented, whereby the failure of the product due to damage in the semiconductor device production process can be prevented and the reliability of the semiconductor device can be maintained for a long time period.

As indicated, the vibration amplitude of the tip end of a bonding tool of the ultrasonic bonding apparatus is set to a value smaller than the film thickness of the metal pad, preferably to a value smaller than one-half of the film thickness of the metal pad. Thereby, occurrence of fine physical failures, such as micro-cracks or cracks, in the metal pad itself or in the insulator film or the semiconductor substrate under the metal pad can be completely eliminated.

According to the ultrasonic bonding apparatus of the present invention, the vibration is controlled so that an vibration amplitude A ($\mu$m) of the tip end of the bonding tool 6 under a no-load condition satisfies $A \leq 4E^{1.6/3}$ when the electric power E input into the ultrasonic vibrator is within the range of $0.001(W) \leq E \leq 1.0(W)$, and the vibration amplitude A ($\mu$m) under a no-load condition satisfies $A \leq 4$ ($\mu$m) when electric power E input into the ultrasonic vibrator is within the range of $1.0(W) \leq E \leq 10.0(W)$.

Therefore, there is an effect in that a large shear stress or a large pressure strain acts to a lesser extent not only on the metal pad, but also on the insulator film or the semiconductor substrate under the metal pad during ultrasonic bonding, and accordingly the probability of occurrence of fine physical failures, such as micro-cracks or cracks, in the metal pad itself or in the insulator film or the semiconductor substrate under the metal pad is substantially reduced and degradations in various kinds of characteristics of the semiconductor device after ultrasonic bonding can be prevented, whereby the failure of the product due to damage in the semiconductor device production process can be prevented and the reliability of the semiconductor device can be maintained for a long time period.

As indicated, the vibration amplitude of the bonding tool is set to a value larger than one-half of the vibration amplitude A ($\mu$m) at the tip end of the bonding tool under a no-load condition when a bonding load during bonding is within 10 N (Newtons), or the ultrasonic frequency of mechanical vibration produced by the ultrasonic vibrator is set to a value above 100 kHz, and the vibration amplitude A ($\mu$m) at the tip end of the bonding tool under a no-load condition and the vibration frequency f (kHz) satisfy the relationship $\log A \geq -0.31 \times \log f^2 + 1.414$.

Therefore, there is an effect in that a large shear stress or a large pressure strain acts to a lesser extent not only on the metal pad, but also on the insulator film 2 or the semiconductor substrate 1 under the metal pad during ultrasonic bonding, and accordingly the probability of occurrence of fine physical failures, such as micro-cracks or cracks, in the metal pad itself or the insulator film or the semiconductor substrate under the metal pad 3 is substantially reduced and the degradations in various kinds of characteristics of the semiconductor device after ultrasonic bonding can be prevented.

What is claimed is:

1. An ultrasonic bonding method comprising the steps of:

pressing down a metal bonding wire to a metal pad provided on a semiconductor substrate using a bonding tool by applying a load no greater than 0.4 Newton to said bonding tool; and vibrating said bonding tool with a smaller vibration amplitude at a tip end of said bonding tool than the thickness of said metal pad and with a vibration frequency higher than 70 kHz.

2. An ultrasonic bonding method according to claim 1, wherein said bonding tool is connected to an ultrasonic vibrator having a piezoelectric device; and a vibration amplitude A ($\mu$m) of the tip end of said bonding tool under a no-load condition is $A \leq 4E^{1.6/3}$ when electric power E input into said piezoelectric device is within a range of $0.001(W) \leq E \leq 1.0(W)$ and a vibration amplitude A ($\mu$m) under a no-load condition is $A \leq 4$ ($\mu$m) when the electric power E input into said piezoelectric device is within a range of $1.0(W) \leq E \leq 10.0(W)$.

3. An ultrasonic bonding method according to claim 2, wherein the vibration amplitude of said bonding tool is a value larger than one-half of the vibration amplitude A ($\mu$m) under a no-load, condition when a bonding load during bonding is within 10 Newtons.

4. An ultrasonic bonding method according to claim 2, wherein a mechanical vibration produced by said ultrasonic vibrator has a relationship $\log A \leq -0.31 \times \log f^2 + 1.414$, under a vibration amplitude A ($\mu$m) under a no-load condition and under a vibration frequency f (kHz).

5. An ultrasonic bonding method according to claim 4, wherein the vibration frequency f (kHz) is above 100 kHz.

6. An ultrasonic bonding method according to claim 1, wherein said metal pad includes an aluminum.

7. An ultrasonic bonding method according to claim 1, wherein an insulator is provided, and the step of pressing down the metal bonding wire includes pressing down the metal bonding wire to the metal pad provided on the semiconductor substrate through the insulator using the bonding tool by applying a load no greater than 0.4 Newton to said bonding tool so that ultrasonic bonding is effected without damage of said semiconductor substrate or said insulator by forming cracks therein.

8. An ultrasonic bonding method comprising the steps of:

pressing metal bonding wire to a metal pad provided on a substrate using a bonding tool;

vibrating a tip end of said bonding tool with a first vibration amplitude and a first vibration frequancy; and vibrating the tip end of said bonding tool with a second vibration amplitude and a second vibration frequency, wherein said second vibration amplitude is smaller than said first vibration amplitude and is less than the thickness of said metal pad, and said second vibration frequency is higher than said first vibration frequency and is higher than 70 kHz.

* * * * *